United States Patent
Hu et al.

(10) Patent No.: US 10,930,530 B2
(45) Date of Patent: Feb. 23, 2021

(54) METHODS AND APPARATUS FOR WAFER TEMPERATURE MEASUREMENT

(71) Applicant: Applied Materials, Inc., Santa Clara, CA (US)

(72) Inventors: Ji-Dih Hu, San Jose, CA (US); Ala Moradian, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 35 days.

(21) Appl. No.: 16/249,588

(22) Filed: Jan. 16, 2019

(65) Prior Publication Data

US 2019/0228997 A1     Jul. 25, 2019

Related U.S. Application Data

(60) Provisional application No. 62/620,674, filed on Jan. 23, 2018.

(51) Int. Cl.
| | |
|---|---|
| *H01L 21/67* | (2006.01) |
| *G01K 11/12* | (2021.01) |
| *G01J 5/34* | (2006.01) |
| *H01L 21/687* | (2006.01) |

(Continued)

(52) U.S. Cl.
CPC ......... *H01L 21/67248* (2013.01); *G01J 5/34* (2013.01); *G01K 11/12* (2013.01); *H01L 21/324* (2013.01); *H01L 21/67115* (2013.01); *H01L 21/68792* (2013.01); *H01L 22/20* (2013.01); *H01L 22/10* (2013.01)

(58) Field of Classification Search
None
See application file for complete search history.

(56) References Cited

U.S. PATENT DOCUMENTS

| | | |
|---|---|---|
| 4,750,139 A | 6/1988 | Dils |
| 5,118,200 A | 6/1992 | Kirillov et al. |
| 6,116,779 A | 9/2000 | Johnson et al. |

(Continued)

FOREIGN PATENT DOCUMENTS

| | | |
|---|---|---|
| KR | 100612203 B1 | 8/2006 |
| KR | 20120122612 A | 11/2012 |

(Continued)

OTHER PUBLICATIONS

TW Search Report for Application No. 108100936 dated Aug. 19, 2019.

(Continued)

*Primary Examiner* — Jay C Chang
(74) *Attorney, Agent, or Firm* — Patterson + Sheridan, LLP

(57) ABSTRACT

A method and apparatus to determine a temperature of a substrate using a spectrum of radiation is disclosed herein. In one aspect, a process chamber includes a lamp assembly optically coupled to a spectrometer. The spectrometer is used to determine a temperature of a substrate within the process chamber. A controller is coupled to the spectrometer and controls the lamp assembly to selectively heat and cool the substrate. In another aspect, a method of includes exposing a substrate to a radiation source. A spectrum of radiation is detected by a spectrometer across a substrate. The spectrum of radiation passed through the substrate is determined and used to determine a temperature of the substrate.

19 Claims, 6 Drawing Sheets

(51) Int. Cl.
    *H01L 21/66*     (2006.01)
    *H01L 21/324*     (2006.01)

(56) References Cited

U.S. PATENT DOCUMENTS

| | | |
|---|---|---|
| 6,164,816 A | 12/2000 | Aderhold et al. |
| 6,563,092 B1 | 5/2003 | Shrinivasan et al. |
| 6,647,350 B1 | 11/2003 | Palfenier et al. |
| 6,799,137 B2 | 9/2004 | Schietinger et al. |
| 6,816,803 B1 | 11/2004 | Palfenier et al. |
| 2003/0036877 A1 | 2/2003 | Schietinger |
| 2006/0086713 A1* | 4/2006 | Hunter ............ F27B 17/0025 219/411 |
| 2006/0228818 A1* | 10/2006 | Chacin ............ H01L 22/12 438/18 |
| 2007/0062439 A1* | 3/2007 | Wada ............ C30B 25/16 117/89 |
| 2008/0198895 A1 | 8/2008 | Davis et al. |
| 2010/0054720 A1 | 3/2010 | Hunter et al. |
| 2011/0186447 A1* | 8/2011 | Boeck ............ G01N 27/36 205/787.5 |
| 2015/0092813 A1 | 4/2015 | Timans |
| 2019/0277747 A1* | 9/2019 | Holt ............ G01N 17/008 |

FOREIGN PATENT DOCUMENTS

| | | |
|---|---|---|
| KR | 20160058490 A | 5/2016 |
| TW | I504871 | 10/2015 |
| TW | 201642381 | 12/2016 |

OTHER PUBLICATIONS

International Search Report and Written Opinion for Application No. PCT/US2019/012383 dated Apr. 30, 2019.
TW Office Action dated Mar. 12, 2020 for Application No. 108100936.

\* cited by examiner

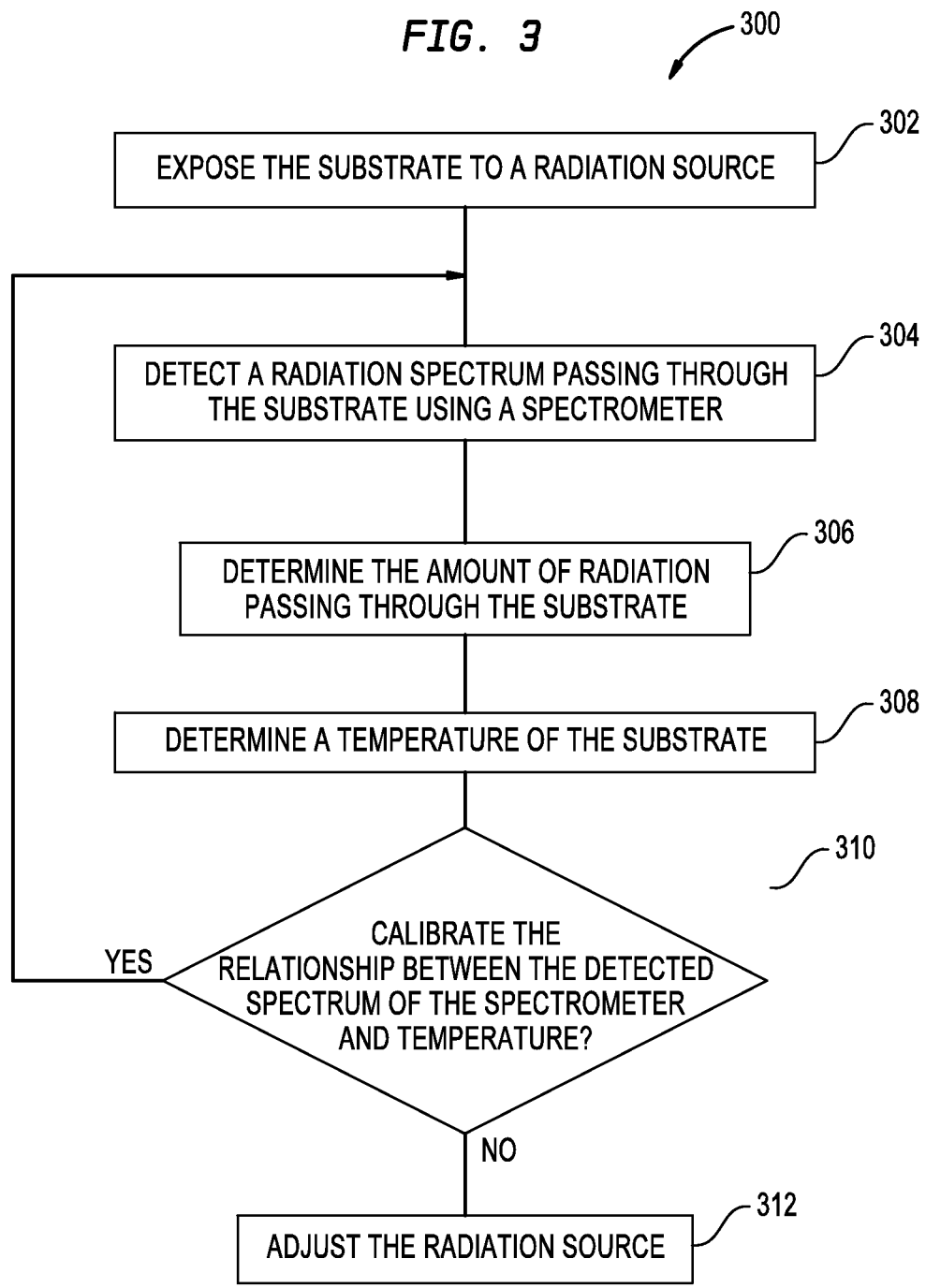

METHODS AND APPARATUS FOR WAFER TEMPERATURE MEASUREMENT

CROSS-REFERENCE TO RELATED APPLICATIONS

This application claims benefit of U.S. provisional patent application Ser. No. 62/620,674, filed Jan. 23, 2018, which is herein incorporated by reference in its entirety.

BACKGROUND

Field

Embodiments described herein generally relate to apparatus and methods of processing substrates. More specifically, apparatus and methods described herein relate to determining temperature relationships of a substrate using spectral radiation.

Description of the Related Art

Transmission pyrometry is a common mode of assessing the thermal state, i.e., the temperature, of a substrate. Thermal process chambers commonly expose a substrate to intense electromagnetic radiation to raise the temperature of the substrate, either of the whole substrate or a part or surface area of the substrate.

Measurement of electromagnetic radiation is used in transmission pyrometry applications to assess the thermal state of the substrate because the amount of radiation absorbed by a substrate, such as a silicon substrate, varies with temperature. Therefore, the substrate temperature can be determined by monitoring a change in the electromagnetic radiation, such as a change in intensity for a given wavelength or a range of wavelengths, passing therethrough. Lasers are typically used as an electromagnetic radiation source for determining the temperature of a substrate in transmission pyrometry because they afford the opportunity to select a particular electromagnetic energy (EM) wavelength best suited for the substrate. Lasers produce coherent EM radiation that, when passed through a substrate, can indicate a thermal state of the substrate, which can be quantified as a temperature. The electromagnetic radiation passing through the substrate is detected by a pyrometer or other EM radiation sensor or array and the detected radiation is compared to the source radiation emitted by the laser. The result of the comparison is then used to determine the substrate temperature. The source EM radiation is conventionally selected to have a small number (e.g., one or two) of specific, narrow wavelength bands that are easily identifiable by an EM radiation sensor, such as a pyrometer. Thus, the portion of the EM radiation emitted from the laser and passing through the substrate need only be analyzed at a small number (e.g., one or two) of specific, narrow wavelength bands.

However, electronic devices, such as devices made of semiconductor materials, continue to incorporate more complicated structures and an increasing density of features thereon and therein. These structures and features are increasingly absorptive to the EM wavelengths commonly used in transmission pyrometry. Therefore, the accuracy of conventional transmission pyrometry measurements is reduced.

Accordingly, there is a need for improved apparatus and methods for reliable temperature measurement of a substrate over a greater number of EM bandwidths, the wavelengths of which are not readily absorbed by the structures and features of the electronic devices, or portions thereof, formed on the substrate.

SUMMARY

In one embodiment, a chamber includes a chamber body defining a processing volume and a lamp assembly coupled to the chamber body. A substrate support assembly is coupled to the chamber body opposite to and facing the lamp assembly and defines a processing plane. A radiation detector is optically coupled to the lamp assembly and disposed opposite from the lamp assembly across the processing plane. The radiation detector has a first light pipe coupled to the processing volume at a first end and a second end coupled to a detection volume, a second light pipe coupled to the detection volume, and a spectrometer coupled to the second light pipe.

In one embodiment, a radiation detection device has a first light pipe coupled to a detection volume. A second light pipe is coupled to the detection volume. A spectrometer and a pyrometer are further coupled to the detection volume.

In one embodiment, a method of processing a substrate includes exposing a substrate to radiation energy. Spectral radiation energy is detected using a spectrometer disposed opposite of the lamp across the substrate. An amount of energy passed through the substrate is determined and used to determine a temperature of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 3 is a flow diagram illustrating a method of processing a substrate according to one embodiment of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides methods and apparatus to determine a temperature of a substrate using an EM radiation spectrum. In one aspect, a process chamber includes a lamp assembly optically coupled to a spectrometer. The spectrometer is used to determine a temperature of the substrate, such as at a single location or at one or more circumferential bands, within the process chamber by detecting EM radiation passed through the substrate. A controller is coupled to the spectrometer and controls the lamp assembly to selectively heat the substrate, or selected areas thereof. In another aspect, a method of thermal processing includes exposing a substrate to an EM radiation source. An EM radiation spectrum which has passed through the substrate is detected by a spectrometer. A spectrum is determined from the source spectrum and the spectrum passed through the substrate, and is used to inferentially determine a temperature of the substrate.

Figure 1:
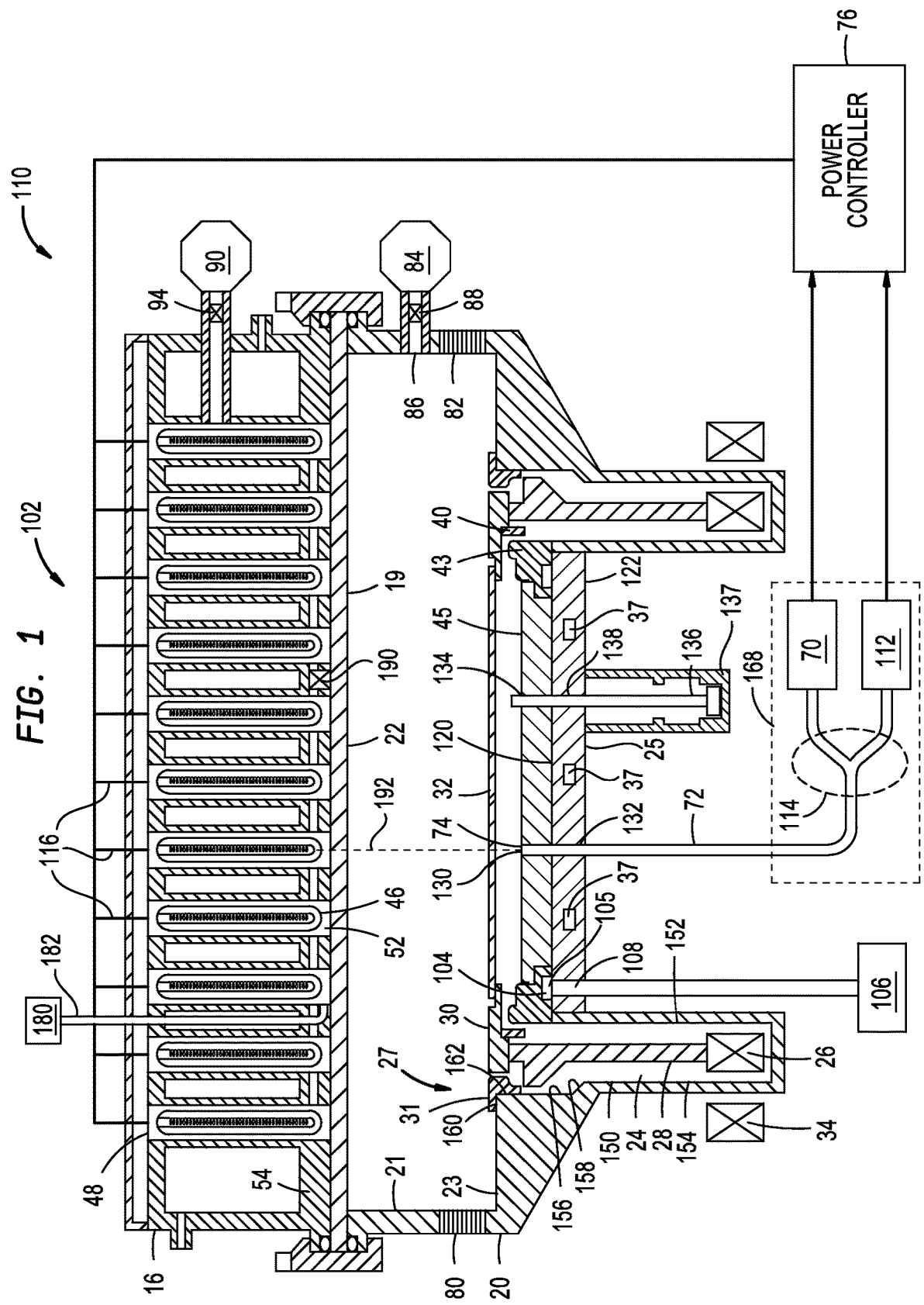
FIG. 1 is a schematic sectional view of an arrangement of a process chamber according to one embodiment of the disclosure.

FIG. 1 is a schematic sectional view of an exemplary process chamber 110 according to one embodiment. The process chamber 110 includes a chamber body 20 having a first portion 21 forming a sidewall of the body 20, a second portion 23 coupled to the first portion and partially defining a floor or base of the body 20, a window 22 disposed on the first portion 21 of the chamber body 20, and a lamp assembly 16 disposed on the window 22. A chamber base 25 is coupled to the chamber body 20 opposite the window 22. The lamp assembly 16 includes a housing 54 with a plurality of openings 52 formed therein. A plurality of lamps 46 is disposed in the housing 54, and a single lamp 46 is disposed within a corresponding opening 52. The lamps 46 are disposed in respective electrical sockets 48 which are concentrically aligned with the corresponding openings 52. The lamps 46 are connected to a power controller 76 via a plurality of electrical conduits 116 and the electrical sockets 48.

During operation, a substrate 32 is loaded into the process chamber 110 through a port (not shown). The substrate 32 is positioned on a plurality of lift pins 136. The lift pins 136 actuate to position the substrate 32 onto the edge support 30. The lamps 46 heat the substrate 32 to a desired processing temperature while the edge support 30 is rotated to rotate the substrate about a central axis during a processing operation. A gas is generally flowed into the chamber to deposit a new material layer or modify a previously deposited layer on the substrate 32. After completion of the processing operation, the substrate 32 may undergo another processing operation within the process chamber 110 or may be removed therefrom. After processing of the substrate 32 in the process chamber 110, the plurality of lift pins 136 are actuated to raise the substrate 32 from the edge support 30. The substrate 32 is then removed from the process chamber 110 through a transfer port (not shown).

The lamps 46 emit EM radiation that passes through the window 22 and towards the substrate 32 disposed in the process chamber 110 to heat the substrate 32 to a processing temperature. The window 22 is typically made of a material chemically resistant to the processing environment and able to allow one or more wavelengths of EM radiation emitted by the plurality of lamps 46 to pass through the window 22 without being substantially attenuated. For example, quartz may be used as the window 22 material. Other suitable materials include, but are not limited to, sapphire, ceramic, and glass.

The window 22 may be coated with an anti-reflective coating, or suitable filters, on one or both sides of the window 22. For example, optional ultra-violet (UV) filters can be used to avoid generation of ions and radicals in the chamber or damage to UV-sensitive structures on the substrate 32 if the lamps 46 have significant UV output. As another example, optional notch filters can be used to block narrow band radiation emitted from the lamps 46. In some embodiments, a filter 19 is disposed on an inside (e.g. process-facing) surface of the window 22. The filter 19 blocks radiation having wavelengths within a specific range from passing therethrough while allowing radiation having wavelengths outside of the specific range to pass. The filter 19 may be a plurality of alternating layers, such as oxide layers. In one embodiment, the filter 19 includes alternating silicon dioxide layers and titanium dioxide layers. For example, the filter 19 may include a total of 30 to 50 alternating layers, such as 35 to 45 alternating layers, with silicon dioxide layers located at opposite sides (e.g. an outside surface and an inside surface) of the filter 19. The filter 19 may be coated on an outside surface (e.g. facing the lamp assembly 16) of the window 22, an inside surface (e.g. facing the edge support 30) of the window 22, or may be embedded within the window 22.

A reflector plate 45 is disposed on the chamber base 25 at a location within the process chamber 110. The reflector plate 45 includes a first plurality of openings 130 and a second plurality of openings 134 extending therethrough. The plurality of lift pins 136 are at least partially extendable within the process chamber 110, and each of the lift pins 136 extends through one of the second plurality of openings 134. The chamber base 25 includes a first plurality of openings 132 and a second plurality of openings 138. Each of the first plurality of openings 132 is aligned with a corresponding opening 130 of the first plurality of openings 130 of the reflector plate 45, and each of the second plurality of openings 138 is aligned with a corresponding opening 134 of the second plurality of openings 134 of the reflector plate 45. Each lift pin 136 is disposed within a receptacle 137 that is coupled to the base 25 of the process chamber 110 and concentric with the openings 134, 138. The lift pins 136 are magnetically actuated to raise and lower through the openings 134, 138.

A first plurality of radiation detectors 70 and a second plurality of radiation detectors 112 are coupled to the process chamber 110. The first plurality of radiation detectors 70 may be a plurality of pyrometers. During operation, the substrate 32 absorbs or reflects visible and shorter wavelength EM radiation emitted by the plurality of lamps 46. The substrate 32 also emits blackbody radiation indicative of a temperature thereof. The first plurality of radiation detectors 70 is sensitive to the blackbody radiation emitted from the substrate 32, rather than the EM radiation emitted from the lamps 46. The first plurality of radiation detectors 70 is used, in conjunction with a controller or other device storing a correlation between substrate emitted blackbody wavelengths and a temperature, to determine a temperature at a single location or at a range of locations, such as circumferential bands, of the substrate 32. The temperature is determined by measuring the blackbody radiation emitted by the substrate 32 and by comparing detected substrate-emitted blackbody wavelength(s) to stored wavelengths, thus determining the substrate temperature correlating to the detected wavelength(s).

The second plurality of radiation detectors 112 is a plurality of transmission detectors that detect an amount of EM radiation emitted by the lamps 46 and passed through the substrate 32. In one embodiment, each of the second plurality of EM radiation detectors 112 is a spectrometer. The spectrometers detect a wavelength-dependent intensity of a spectrum of EM radiation which has passed through a substrate (e.g., a silicon substrate), such as the substrate 32, to inferentially determine the temperature of the substrate.

A plurality of probes 74 are disposed within the openings 130 formed in the reflector plate 45. The probes 74 extend through respective openings 132 formed in the chamber base 25. The probes 74 may be placed in different radial zones correlating to heating zones of the substrate 32, such as a plurality of concentric rings, in order to receive EM radiation emitted by the substrate 32 and EM radiation passing through the substrate 32 and determine a temperature profile of the substrate 32. One or more probes 74 are optically connected to the first plurality of radiation detectors 70 and the second plurality of radiation detectors 112. In one embodiment, each probe 74 is connected to one radiation detector 70 and one radiation detector 112 via a light guide 72. In some embodiments, each of the radiation detectors 70, 112 receives radiation from a dedicated probe 74 (i.e., one probe 74 for each pair of radiation detectors 70, 112). In some embodiments, the radiation detectors 70, 112 are disposed in a detection assembly 168. The detection assembly 168 may have a splitter 114 to direct a portion of the received radiation to each of the radiation detectors 70, 112.

In one embodiment, the probe 74 has a filter (not shown) which allows a specified wavelength or range of wavelengths to pass therethrough while preventing other wavelengths from passing therethough. The wavelength or range of wavelengths allowed to pass through the filter are selected in relation to the wavelengths desired to be detected by one or both of the radiation detectors 70, 112. For example, one or both of the radiation detectors 70, 112 may be tuned to specific wavelengths which are selected to pass through the filter. The filter may be, for example, one or more reflective coatings, one or more absorptive coatings, or a combination thereof. In certain embodiments, the radiation detector 70, 112 coupled to the probe 74 or a controller has software configured to remove undesired wavelengths from the detector result.

During operation, the lamps 46 generate EM radiation that is emitted therefrom towards the substrate 32. A portion of the EM radiation typically passes through the substrate 32. The intensity of the EM radiation that passes through the substrate 32 is a function of the temperature of the substrate 32 and of the wavelength of the EM radiation. The probes 74 receive the EM radiation that passes through the substrate 32. In one embodiment, a central axis of each of the probes 74 is aligned with a central axis of one of the lamps 46, such as along axis 192 of the lamp 46. The probes 74 direct the received EM radiation to the radiation detectors 70, 112. The probes 74 also receive EM radiation directly emitted by the substrate 32, which is also directed to the radiation detectors 70, 112. At low temperatures, such as below 300 degrees Celsius, a negligible amount of blackbody radiation is emitted by the substrate 32. Therefore, the use of the radiation detected by either of the radiation detectors 70, 112 to determine the temperature of the substrate 32 is selected in relation to the processing state of the substrate (e.g. determined temperature). For example, if an EM radiation spectrum detected by the radiation detector 112 departs from a selected operational range thereof, either by the intensity of received EM radiation, a temperature determined from the received EM radiation, or another aspect of the received EM radiation used to determine the substrate temperature, the temperature determination may be performed using the corresponding radiation detector 70, and vice versa. In one embodiment, the radiation detectors 70 are utilized when a temperature, such as that of a single point or a circumferential band, of the substrate 32 is determined to be in a first temperature range, for example, from 350 degrees Celsius to 1500 degrees Celsius, and the radiation detectors 112 are utilized when a temperature, such as at a single point or a circumferential band, of the substrate 32 is determined to be in a second temperature range, for example, from 20 degrees Celsius to 350 degrees Celsius. The determined temperature or temperature profile is sent to the power controller 76, which controls the power supplied to the lamps 46 in response to the determined temperature at a point or circumferential band on the substrate 32 or a temperature profile thereof.

It should be noted that, whereas the description above refers to a plurality of radiation detectors 112 and a plurality of radiation detectors 70, the chamber 100 may have one radiation detector 112 and one radiation detector 70. The chamber 100 may also have one radiation detector 112 and a plurality of radiation detectors 70, or one radiation detector 70 and a plurality of radiation detectors 112. In some cases, the chamber 100 has multiple detection assemblies 168 and probes 74 to which a radiation detector 70, a radiation detector 112, or both, may be coupled. Providing multiple probes 74 and detection assemblies 168, each with connections for radiation detectors 112, 70, allows flexibility in utilizing radiation detectors of the two types in multiple available configurations.

An incident radiation detector 180 is optionally coupled to the housing 54 of the lamp assembly 16. The incident radiation detector 180 is a spectrometer or a pyrometer. The incident radiation detector 180 receives EM radiation emitted by the plurality of lamps 46 via a light guide 182. The light guide 182 in FIG. 1 has an end optically coupled to one of the openings 52 and the corresponding lamp 46 therein. In this configuration, the light guide 182 does not block any radiation from reaching the substrate 32. Other positions of the light guide 182, for example, extending through the first portion 21 of the body 20, may also be used. The incident radiation detector 180 is used to sample the EM radiation emitted by the plurality of lamps 46 at a position before the emitted EM radiation interacts with the substrate 32. The EM radiation detected by the incident radiation detector 180 can be compared to the EM radiation detected by the radiation detectors 112 to determine the amount of EM radiation that passes through the substrate 32 as discussed herein. In some cases, the incident radiation detector 180 is the radiation detector 112. That is, the light guide 182 is coupled to the radiation detector 112, so that the radiation detector 112 is used as both an incident radiation detector and a transmitted radiation detector. In other cases, the incident radiation detector 180 and the radiation detector 112 are identical but distinct detectors. In still other cases, the incident radiation detector 180 and the radiation detector 112 are similar but not identical detectors.

In one embodiment, the lamps 46 are arranged in the housing 54 in a honeycomb array. The lamps 46 may be divided into groups to define multiple heating zones on the substrate 32. In one embodiment, the heating zones are concentric rings. One probe 74, or a portion of the plurality of probes 74, may correspond to one of the zones. A temperature or temperature signal determined by operation of the radiation detectors 70, 112, which may correspond to a defined heating zone by virtue of the arrangement of the probes 74, is provided to the power controller 76. The power controller 76 can individually adjust the power supplied the lamps 46 corresponding to the one or more heating zones to adjust the energy emitted thereto. Therefore, the temperature profile across the substrate 32 can be adjusted as desired.

Additionally, a plurality of detectors 190 can be disposed within the housing 54. In FIG. 1, one detector 190 is shown. The detector 190 is located between adjacent openings 52 and proximate to the window 22. The detector 190 is line-of-sight exposed to an upper surface of the substrate 32 through the window 22. The detector 190 is used to determine a temperature of the substrate 32 at an upper surface thereof in the area which is line-of-site exposed to the detector 190. In one embodiment, multiple detectors 190 form an array used to determine a temperature in multiple zones of the substrate 32. In one embodiment, the detector 190 is an optical sensor, such as a pyrometer, and receives EM radiation emitted from the upper surface of the substrate 32. A measured parameter of the EM radiation received by detector 190 from the substrate 32, such as wavelength or intensity, is used to determine temperature of the substrate 32. In another embodiment, the detector 190 is a reflectometer which measures reflectivity of the substrate 32. The measured reflectivity is compared to a known temperature-reflectivity relationship to determine temperature of the substrate 32. It is also understood that the detector 190 is not limited to the embodiments described above. Other types of detectors may be used to determine temperature of the substrate 32.

Returning to the chamber body 20 of FIG. 1, an inlet port 80 and an outlet port 82 are formed in the first portion 21 of the chamber body 20. A vacuum pump 84 evacuates the process chamber 110 by pumping through an exhaust port 86 formed in the first portion 21 of the chamber body 20. A valve 88 disposed between the exhaust port 86 and the vacuum pump 84 is utilized to control the pressure within the process chamber 110. The valve 88 is selectively opened, closed, or partially opened (i.e., throttled) to change the rate at which gas is exhausted from the process chamber 110. A second vacuum pump 90 is connected to the lamp assembly 16. The pressure within the lamp assembly 16 is controlled by a valve 94 disposed in a foreline of the second vacuum pump 90.

An annular channel 24 is formed in the chamber body 20, and a rotor 26 is disposed in the channel 24. The channel 24 is located adjacent to the second portion 23 of the chamber body 20. The process chamber 110 further includes a rotatable support member 28 disposed in the channel 24, an edge support 30 disposed on the rotatable support member 28, and a shield 27 disposed on the second portion 23 of the chamber body 20. The rotatable support member 28 is fabricated from a material having minimal change in material properties, such as tensile strength or thermal expansion, across a range of temperatures, or resistance to degradation due to exposure to heat. An exemplary material is quartz. In one embodiment, the rotatable support member 28 is cylindrical. In one embodiment, the edge support 30 is an annular edge ring on which the circumferential edge of the substrate 32 is supported during the processing thereof. Together, the rotatable support member 28 and the edge support 30 define a substrate support assembly.

The channel 24 has an outer wall 150 and an inner wall 152. A lower first portion 154 of the outer wall 150 has a first radius and an upper second portion 156 of the outer wall 150 has a second radius greater than the first radius. A third portion 158 of the outer wall 150 connecting the first portion 154 to the second portion 156 has a cross-sectional profile that extends linearly from the first portion 154 to the second portion 156, forming a slanted surface that faces toward the edge support 30. The shield 27 has a first portion 160 that rests on the second portion 23 of the chamber body 20 and a second portion 162 that extends into the channel 24 along the se portion 156 of the outer wall 150. The first portion 160 of the shield 27 contacts the second portion 23 of the chamber body 20, and the second portion 162 of the shield 27 contacts the second portion 156 of the outer wall 150. The shield 27 extends partially over the channel 24. In one embodiment, the shield 27 is a rotor cover. The shield 27 may be an annular ring, or in some cases, the shield 27 may have one or more gaps extending in a radial direction from a center thereof. The shield 27 can be fabricated from a ceramic material, such as alumina. The shield 27 further includes a first surface 31 facing the window 22. The first surface 31 is substantially flat, and does not face a portion of the substrate processing region of the chamber 110 located above the substrate 32, so radiant energy is not reflected therefrom towards the substrate 32. In one embodiment, the first surface 31 of the shield 27 is substantially parallel to the window 22. In one embodiment, the first surface 31 is annular.

The substrate 32, typically a semiconductor substrate, and in some cases a high resistivity silicon substrate, is disposed on the edge support 30 during operation. A stator 34 is located external to the chamber body 20 in a position axially aligned with the rotor 26. In one embodiment, the stator 34 is a magnetic stator, and the rotor 26 is a magnetic rotor. The stator 34 has a plurality of electric coils therein which circumscribe the channel 24. During operation, the stator 34 applies a sequence of currents to the coils at defined intervals. The currents within the coils create a series of magnetic fields which are coupled to a magnetic portion of the rotor 26, such as a magnet disposed therein, through the outer wall 150. The currents are applied the coils in a sequence so that the magnetic fields formed therein attract the magnetic portion of the rotor 26 and bias the rotor 26 to rotate about an axis which in turn rotates the rotatable support member 28 magnetically coupled thereto, the edge support 30, and the substrate 32.

During an operation in which the substrate 32 is heated to a relatively low temperature, such as from about 20 degrees Celsius to about 350 degrees Celsius, the edge support 30 does not convect heat to the surrounding volume as quickly as the substrate 32. Therefore, the temperature of a portion of the substrate 32 near, or in contact with, the edge support 30, such as an edge of the substrate 32, can be higher than the temperature at a center thereof. In order to cool the edge support 30, a cooling member 43 can be disposed on the chamber base 25 in proximity to the edge support 30. The cooling member 43 convects heat from the edge support 30 and the substrate 32 when disposed thereon. The chamber base 25 includes a first surface 120 and a second surface 122 opposite the first surface 120. As depicted in FIG. 1, the cooling member 43 is in direct contact with the first surface 120 of the chamber base 25.

A thickness of the edge support 30 may be selected to provide a desired thermal mass. Thus, edge support 30 can act as a heat sink, which helps avoid overheating at the edge of the substrate 32. In one embodiment, a feature 40, such as a fin, is formed on the edge support 30 to provide thermal mass. In certain configurations, such as the fin configuration, the feature 40 also improves convection of heat from the edge support 30 to the surrounding volume. The feature 40 may be continuous, for example cylindrical, or discontinuous, for example a plurality of discrete fins. The feature 40 may be formed on a surface of the edge support 30 that is facing the channel 24 when the edge support 30 is installed in the chamber 100, and may extend into the channel 24, as shown in FIG. 1. In other embodiments, the feature 40 is formed on a surface of the edge support 30 that is facing the window 22. In still other embodiments, a combination of one or more features 40 facing the channel 24 and one or more features 40 facing the window 22 may be used. As depicted in FIG. 1, the feature 40 may be substantially perpendicular to a major surface of the edge support 30. In other embodiments, the feature 40 may extend obliquely from the major surface of the edge support 30.

The chamber base 25 includes a plurality of channels 37 formed therein for a coolant, such as water, to flow through. Cooling the chamber base 25 also draws heat from, and thus cools, the cooling member 43. The cooling member 43 may be fabricated from a material having high heat conductivity, such as a metal, for example, aluminum. The cooling member 43, in turn, functions as a heat sink to the edge support 30 due to close proximity of the cooling member 43 to the edge support 30.

The cooling member 43 includes a recess 104 formed in the surface thereof that is in contact with the first surface 120 of the chamber base 25. The recess 104 can be used to circulate a cooling fluid for further cooling of the cooling member 43. In one embodiment, the cooling member 43 is an annular ring, and the recess 104 is an annular recess. A cooling gas may be flowed from a gas source 106 through the cooling member 43 via the recess 104 to provide additional cooling of the cooling member 43. The cooling gas increases heat transfer between the cooling member 43 and the edge support 30, thus further cooling the edge support 30. The cooling gas may be helium, nitrogen, or other suitable gas. The cooling gas flows through a passage 108 formed in the chamber base 25 and through a channel 105 defined between the recess 104 and the first surface 120 of the chamber base 25.

Figure 2:
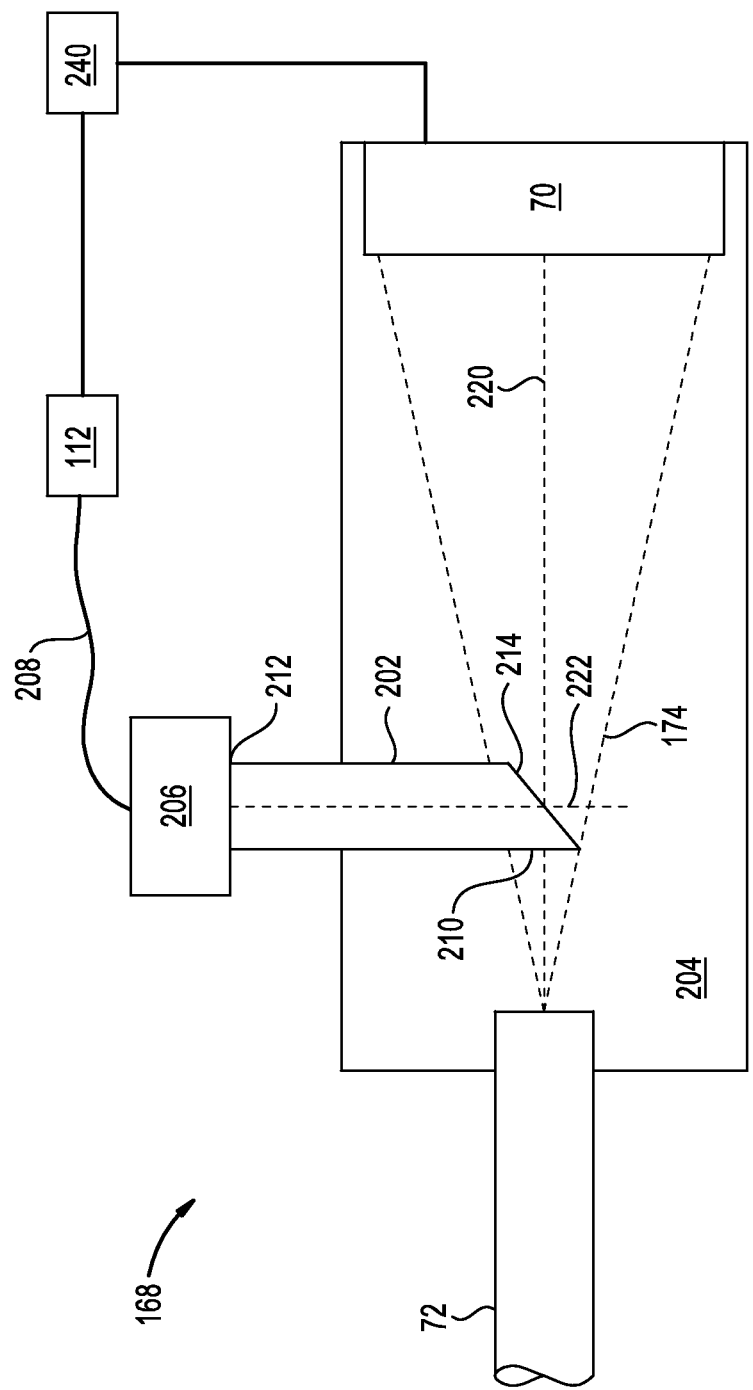
FIG. 2 is a schematic side view of a detector assembly usable in the process chamber of FIG. 1 according to one embodiment of the disclosure.

FIG. 2 is a schematic side view of a detection assembly 168 according to one embodiment. As shown in FIG. 2, electromagnetic radiation 174, which is emitted by the lamps 46 and the substrate 32 and passed though the substrate 32, exits the light guide 72 into a first portion of a detection volume 204. The light guide 72 has a diameter, for example, of about 2 millimeters. The radiation detector 70 is disposed in a second portion of the detection volume 204. In one embodiment, the light guide 72 is disposed along an axis 220 that is substantially perpendicular to a major axis of the radiation detector 70. A light guide 202 has a first end 210 disposed within the detection volume 204 between the light guide 72 and the radiation detector 70. A second end 212 of the light guide 202 is disposed outside of the detection volume 204 and is coupled to a fiber coupling 206. A fiber optic cable 208 couples the fiber coupling 206 to the radiation detector 112. A light guide may also be used in place of the fiber optic cable 208.

The first end 210 of the light guide 202 has a bevel 214. In one embodiment, the bevel 214 forms an angle of 45 degrees relative to a plane that is substantially perpendicular to the central axis 222 of the light guide 202. The light guide 202 has a diameter, for example, of about 1 millimeter. The bevel 214 directs a portion of the electromagnetic radiation 174 towards the second end 212 of the light guide 202 by reflecting a portion of the electromagnetic radiation 174. The reflected EM radiation is directed by the light guide 202 to the fiber coupling 206, which is coupled to the radiation detector 112 by the fiber optic cable 208. As described above, the radiation detector 112 is a spectrometer that produces a wavelength-dependent intensity spectrum of the electromagnetic radiation 174 that, along with the signal produced by the radiation detector 70, is used to determine a temperature of the substrate 32 (as described in connection with FIG. 1). Since the amount of blackbody radiation emitted by the substrate 32 at low temperatures, such as below 300 degrees Celsius, is negligible in most cases, the radiation detector 112 can use the electromagnetic radiation 174 to determine the temperature of the substrate 32 by detecting the intensity of the EM radiation spectrum passing therethrough.

The radiation detectors 70, 112 are optionally coupled to a processing unit 240. The processing unit 240 may be part of the power controller 76 of FIG. 1, or may be part of the detection assembly 168. The processing unit 240 converts outputs from the radiation detectors 70, 112 to determine a temperature of the substrate 32. The temperature may be determined by methods described further below.

FIG. 3 is a method of processing a substrate according to one embodiment. The method 300 may be practiced with the apparatus of FIG. 1 and FIG. 2. In the method 300, a substrate is exposed to EM radiation from an EM radiation source at 302. The EM radiation source is, for example, the lamps 46 of FIG. 1. The substrate absorbs a portion of the EM radiation received from the EM radiation source and a portion of the received EM radiation passes through the substrate. At 304, a spectrum of the EM radiation passed through the substrate is detected by a spectrometer. The portion of the EM radiation which passed through the substrate is determined at 306.

In one embodiment, the portion of the EM radiation passing through the substrate is found by relating the spectrum of the emitted EM radiation from the EM radiation source to the spectrum of the EM radiation detected by the spectrometer. For example, the spectrum of EM radiation passing through the substrate is found by calculating the difference between the spectrum emitted by the EM radiation source and the spectrum passing through the substrate and detected by the spectrometer. In some embodiments, the spectrum emitted by the EM radiation source can be predetermined by correlating one or more properties of the EM radiation source, such as a type of lamp and power supplied thereto, to an emitted EM radiation spectrum. A temperature of the substrate is determined at 308 using the spectrum of the EM radiation passing through the substrate as determined in 306. Exemplary methods of determining temperature are discussed below.

At 310, a calibration relationship of the spectrometer signal to substrate temperature is optionally checked. Exemplary methods of calibration are also discussed below. A control system adjusts the calibration relationship as needed. Operations 304-308 are then repeated to determine the amount of EM radiation passing through the substrate and thus the temperature of the substrate. Returning to 310, if the spectrometer detection result-temperature relationship is properly calibrated the method proceeds to 312. At 312, the determined temperature of the substrate is provided to a controller that is coupled to the EM radiation source. The EM radiation source is adjusted as needed by the controller to heat the substrate in a desired manner in response to the determined temperature of the substrate.

Figure 4A:
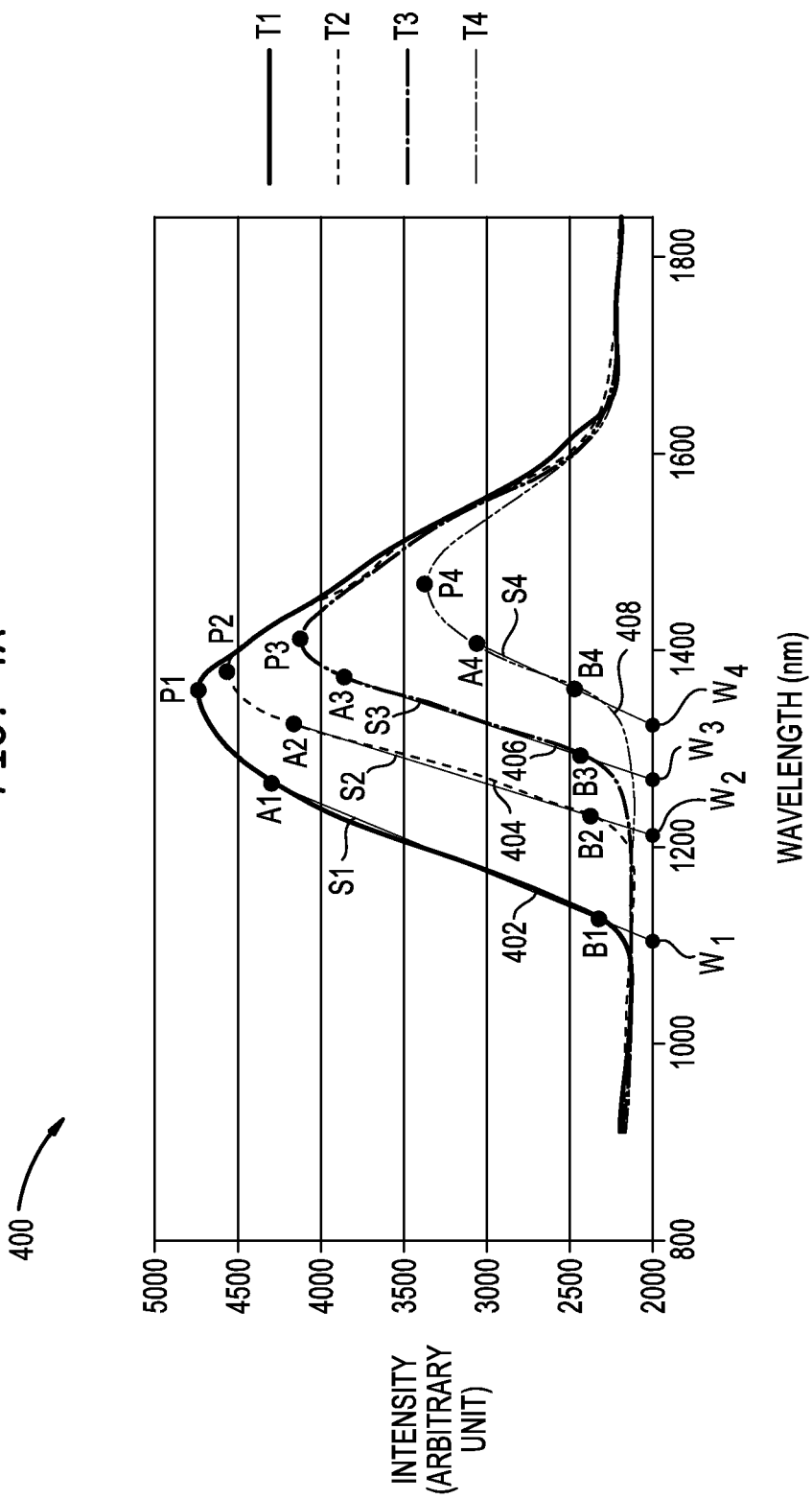
FIGS. 4A and 4B are graphs of wavelength-dependent intensities of electromagnetic radiation passed through one type of substrate.
Figure 4B:
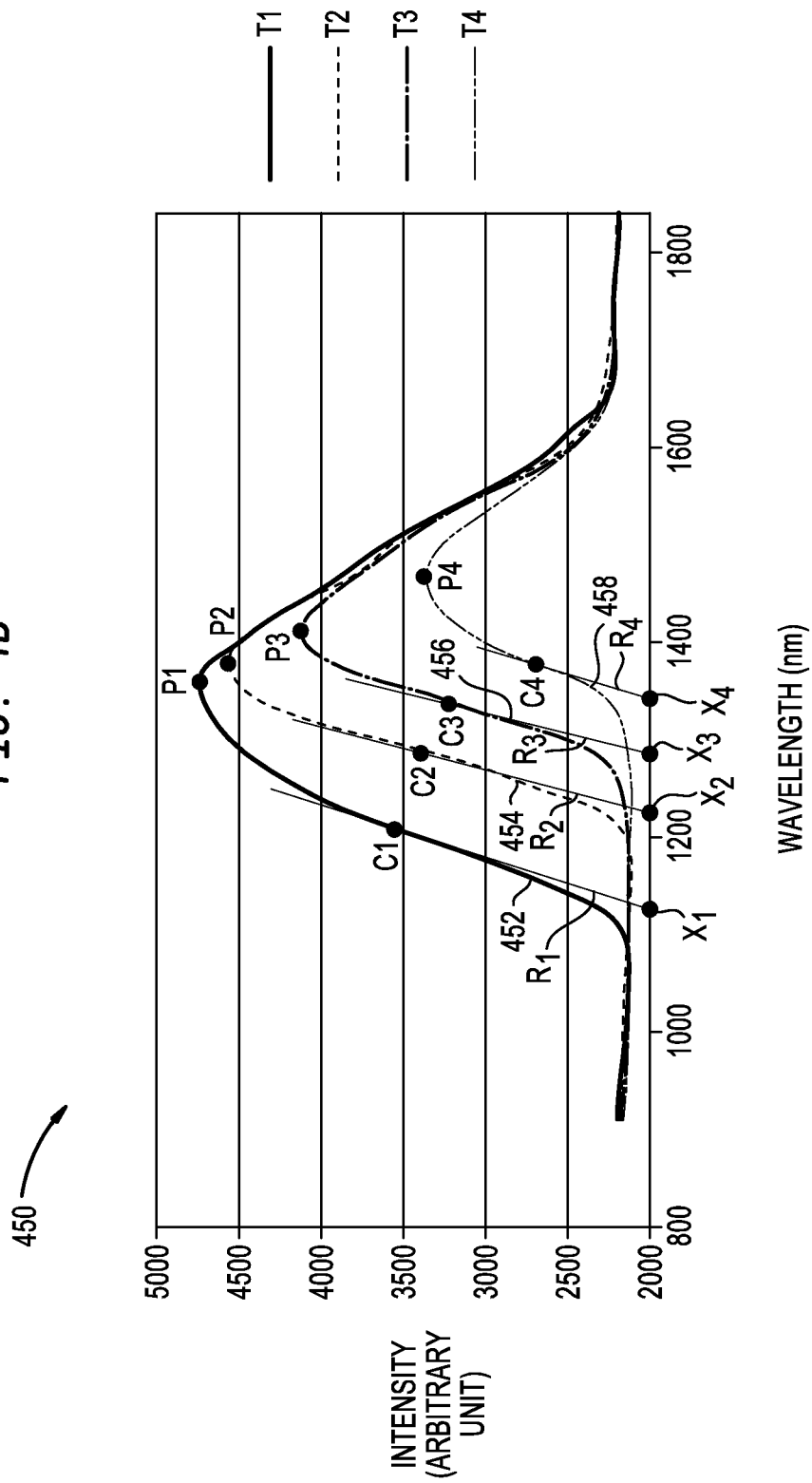

FIGS. 4A and 4B are graphical illustrations of wavelength-dependent intensity of EM radiation passed through a substrate during thermal processing thereof using EM radiation emitted from lamps. In FIG. 4A, graph 400 shows curves 402, 404, 406, and 408 which represent the intensity of EM radiation passing through a substrate, as a function of the EM radiation wavelength, at four different temperatures T1, T2, T3, and T4, respectively. The curves 402, 404, 406, and 408 thus represent the spectrum of EM radiation from the lamps that passed through the substrate at the respective temperatures. In FIG. 4B, graph 450 shows curves 452, 454, 456, and 458 which represent the intensity of EM radiation passing through a substrate, as a function of the EM radiation wavelength, at four different temperatures T1, T2, T3, and T4, respectively. The curves 452, 454, 456, and 458 thus represent the spectrum of EM radiation from the lamps that passed through the substrate at the respective temperatures.

The graph 400 of FIG. 4A and graph 450 of FIG. 4B are identical but are indicate different points on the respective curves used to describe methods of determining temperature below. That is, the curves 452, 454, 456, and 458 are identical to the respective curves 402, 404, 406, and 408 but indicate different points thereon and corresponding slopes thereof. Here, T1 is the lowest temperature and represents, for example, room temperature. T4 is the highest temperature and represents, for example, 600 degrees Celsius. T2 and T3 correlate to temperatures that are about evenly distributed between the temperatures represented by T1 and T4. As shown in FIGS. 4A and 4B, the intensity of the spectrum of EM radiation passing through a substrate, such as a silicon substrate, for a given wavelength changes as the temperature of the substrate changes. Said differently, the amount of EM radiation absorbed by the substrate changes with a change of the substrate temperature. The relationship of EM radiation passed through the substrate and the difference in the transparency to different EM wavelengths at different substrate temperatures can be utilized to inferentially determine the temperature of the substrate.

Referring to FIG. 4A, a first method of determining a temperature of the substrate utilizes a slope between two points of each of the curves 402-408 for a known substrate as a calibration standard. In an exemplary method, curves 402, 404, 406, and 408 are first defined for a known substrate having the same structures, such as layer type, thickness, and materials, and features formed therein and thereon, as the substrate being processed. Next, a maximum point P is defined for each curve, where P is the maximum measured intensity of the respective curve. Intensity is generally expressed in a unit such as watt per steradian per meter but is shown in FIGS. 4A and 4B as an arbitrary unit. In FIG. 4A, P1 is the maximum measured intensity of curve 402, P2 is the maximum measured intensity of curve 404, P3 is the maximum measured intensity of curve 406, and P4 is the maximum measured intensity of curve 408. Then, shoulder points are defined for each curve. A first shoulder point A for each curve is defined at a first abscissa value, i.e., x axis location, that is α% (for example, 80%) of the abscissa of the corresponding maximum points P1, P2, P3, and P4 of the respective curve. The point on each curve at the first abscissa value that has the lowest ordinate value is defined as the point A1, A2, A3, and A4 of the respective curve. The first abscissa value may be different for each curve. A second shoulder point B for each curve is defined as points B1-B4 for the corresponding curves 402, 404, 406, 408 at a second abscissa value that is β% (for example, 20%) of the value of the abscissa of the corresponding maximum point P1-P4. The point on each curve at the second abscissa value that has the lowest ordinate value is defined as the point B1-B4.

Next, a slope S between corresponding points A and points B is defined for each curve 402, 404, 406, 408. For example, S1 is the slope of the line connecting points A1 and B1, S2 is the slope of the line connecting points A2 and B2, S3 is the slope of the line connecting points A3 and B3, and S4 is the slope of the line connecting points A4 and B4. Then, the slopes S1-S4 are each related to a temperature corresponding to the curves 402, 404, 406, 408. A curve fit equation T(S) is then calculated to relate the slopes to temperature for substrates having the same structures as a known substrate, such as layer type, thickness, and materials, and features formed therein and thereon. A slope S* of a curve of a detected spectrum of EM radiation passed through unknown substrate is found as described above between points A* and B*. If the unknown substrate has the same structures as the known substrate, a temperature T* is then determined for S* using the curve fit equation.

Referring to FIG. 4B, a second method to determine a temperature of a substrate utilizes the inflection points C (C1-C4) for each curve 452, 454, 456, and 458. The inflection points C are determined for each curve 452-458 by calculating the zero point of the second derivative for each curve. Points C, for each curve, correspond to the zero point of the second derivative where the first derivative is positive. For example, to find point C1, the relevant inflection point for curve 452, a first function is defined as the first derivative of the curve 452. A range of wavelengths is then defined where the first derivative is positive. Then, a second function is defined as the second derivative of the entire curve 452, or just for the portion of the curve 452 where the first derivative is positive. Next, the abscissa, or abscissas, where the second derivative of the curve 452 is zero is calculated. The point C1 has an abscissa value where second derivative of the curve 452 has a zero solution and an ordinate value where the first derivative of the curve 452 is positive. The same procedure applies for finding corresponding inflection points C2, C3, and C4 for respective curves 454, 456, and 458. A curve fit of the inflection points C1, C2, C3, and C4 can be used as a calibration standard for relating a detected spectrum of EM radiation passed through an unknown substrate to a temperature of the substrate. This method may also be used to determine an inflection point a range of wavelengths where the first derivative is negative.

By comparing the inflection point of a detected spectral curve of EM radiation passed through an unknown substrate to known inflection points, such as points C1-C4, for a temperature range determined using the same method for a known substrate, the temperature of the unknown substrate having the same structures as the known substrate can be determined. For example, if there are two known inflection points C1 ($\lambda 1$, I1, T1) and C2 ($\lambda 2$, I2, T2), where $\lambda 1$ is the wavelength of the inflection point C1, I1 is the intensity of the inflection point C1, T1 is the temperature of the inflection point C1, and $\lambda 2$, I2, and T2 are the corresponding values for the inflection point C2, a temperature T* can be determined for an inflection point C* of a detected spectrum. The wavelength and intensity values, $\lambda^*$ and I*, are determined from the detected spectrum, an interpolation constant is determined from the wavelengths and intensities of the three points, and the interpolation constant is applied to the temperatures T1 and T2 to determine T*.

Alternatively, the value of the first derivative at the inflection point of a detected spectral radiation curve of EM radiation passed through an unknown substrate can be compared to the first derivative at the inflection points for a spectral radiation curve of EM radiation passed through a known substrate to determine a temperature of the unknown substrate. For example, to determine the first derivative value of the curve 452 at the point C1, the point C1 is first found using the operation described above. Then, the value of the first derivative of the curve 452 is calculated at the point C1. The same operation is performed for the other inflection points C2, C3, and C4. A curve fit equation for inflection point first derivatives with respect to temperature can be defined. Comparing the inflection point first derivative of the curve of detected spectral EM radiation passed through the unknown substrate to the temperature-dependent inflection point first derivatives of the curve of a spectral EM radiation passed through the known substrate can determine the temperature of the unknown substrate.

In further embodiments, a characteristic wavelength is used to determine a temperature of the substrate 32. In one embodiment, the characteristic wavelength is defined as the abscissa (i.e. wavelength) where a characteristic line of a detected curve of a spectrum of EM radiation passed through a substrate intercepts the x-axis. Referring again to FIG. 4A, an exemplary characteristic line is the slope S* between the points A* and B* described above. For example, the slopes S1, S2, S3, and S4 of the curves 402, 404, 406, and 408 of a detected spectrum of EM radiation which have passed through a known substrate, i.e., a substrate having a known structure, are first determined using the method described above. Then, the x-intercept wavelength is determined for each slope S1, S2, S3, and S4 which is the characteristics wavelength W corresponding to each curve 402, 404, 406, and 408. W1 corresponds to the x-intercept of the slope S1. W2 corresponds to the x-intercept of the slope S2. W3 corresponds to the x-intercept of the slope S3. W4 corresponds to the x-intercept of the slope S4. Next, the process is repeated to determine a characteristic wavelength W* of a slope S* between A* and B* of a curve of a detected spectrum of EM radiation passed through an unknown substrate. The characteristic wavelength W* of the slope S* is compared to the characteristic wavelengths W1, W2, W3, and W4 for the respective slopes S1, S2, S3, and S4 of the known substrate to inferentially determine the temperature of the unknown substrate.

In another embodiment, the characteristic wavelength is the x-intercept of a tangent line defined for a single point for a curve of detected spectrum of EM radiation which has passed through a substrate, such as a line tangent to a curve at an inflection point. Referring now to FIG. 4B, the inflection point C1 is determined for the line 452 using the method described above for a known substrate. Next, the slope is determined of the curve 452 at the point C1 (i.e. the first derivative value at the point C1). Then, a tangent line R1 is defined using the determined slope at the point C1. The x-intercept is then calculated for the tangent line R1 of the curve 452 of the point C1. The x-intercept is the characteristic wavelength X1 of the tangent line R1 of the curve 452 and the point C1. The process is then repeated to determine the characteristic wavelengths X2, X3, and X4 of the respective tangent lines R2, R3, and R4 at the points C2, C3, and C4 corresponding to curves 454, 456, and 458. Then, the characteristic wavelength X* is found for a tangent line R* at the inflection point C* of a curve of a detected spectrum of EM radiation passed through an unknown substrate. The characteristic wavelength for the curve of a detected spectrum of EM radiation passed through an unknown substrate is compared to the characteristic wavelengths of the curves of spectrum of detected EM radiation passed through the known substrate to determine the temperature of the unknown substrate.

The process of detecting a spectrum of EM radiation which has passed through a known substrate can be performed on multiple substrates having different known structures, such as in controlled tests. For example, the known structures can differ in substrate material, number and material of layers formed thereon, doping of formed layers, or layer thickness, among other differences. In such cases, a database of detected spectrums of EM radiation passed through the known substrates with differing known structures can be created. The data thereof, such as the slopes, inflection points, tangent lines, or characteristic wavelengths can be referenced to determine temperature of unknown substrates using the methods described herein.

In some embodiments, the temperature of an unknown substrate can be determined by comparing the integrals of the curve of detected spectral EM radiation passed through the unknown substrate to the integrals of the curves of detected spectral EM radiation passed through a known substrate for a range of temperatures in cases when the unknown substrate has the same structures as the known substrate.

Figure 5:
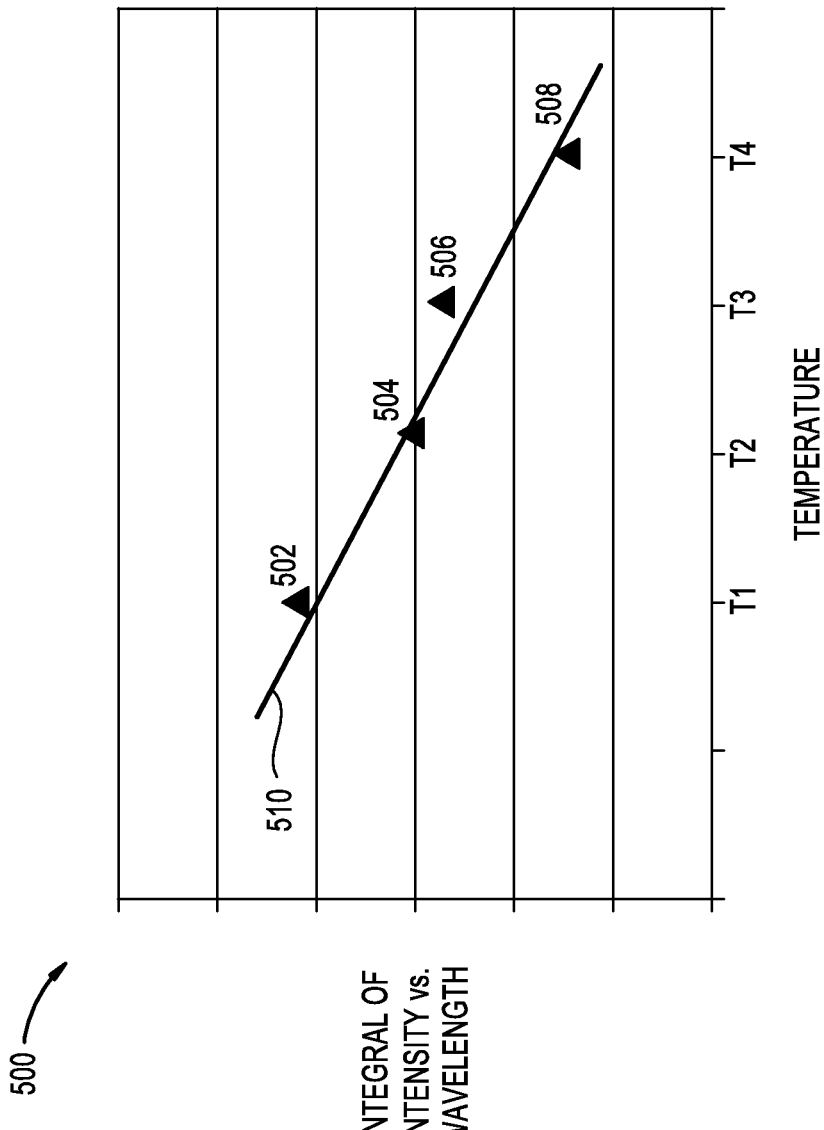
FIG. 5 is a graph of wavelength-integrated transmission intensity versus temperature for one type of substrate.

FIG. 5 is a graph of wavelength-integrated transmitted spectrum versus temperature for one type of substrate. The points 502, 504, 506, and 508 plotted in FIG. 5 are values of the respective integrals of the curves 402, 404, 406, and 408 plotted against the respective temperature for each curve 402, 404, 406, and 408. For example, point 502 is the value of the integral of the curve 402 at temperature T1. Line 510 is a regression of the points 502-508. In FIG. 5, the relationship between points 502-508 is statistically linear. Accordingly, an integral value of a curve of detected spectral EM radiation passed through an unknown substrate can be used to determine temperature of the unknown substrate by comparing the calculated integral value to the known relationship, such as line 510, for the curves of EM radiation passed through the known substrate having the same structures as the unknown substrate.

In further embodiments, a temperature of an unknown substrate is determined by comparing the signal ratios of the detected EM radiation spectrum passed through the unknown substrate to the signal ratios of the detected EM radiation spectrum passed through a known substrate at various temperatures. For example, the signal ratio may the ratio of detected EM radiation intensity of a spectrum passed through the substrate at elevated temperature to detected EM radiation intensity of a spectrum passed through the substrate at room temperature. Alternatively, the integral of the signal ratio of the EM radiation spectrums passed through the substrate may be used to determine temperature thereof. Additionally, characteristic wavelengths of the curves of the signal ratio of a spectrum of EM radiation which has passed through a substrate may be used to determine the temperature thereof. For example, the x-intercept of a line tangent to a curve of the signal ratio defines the characteristic wavelength.

In still further embodiments, a signal delta of the EM radiation passed through the substrate is used to determine a temperature thereof. An exemplary signal delta is the difference in EM radiation intensity of a spectrum passed through the substrate at an elevated temperature and EM radiation intensity of a spectrum passed through the substrate at room temperature. Again, an integral of the signal delta of EM radiation passed through the substrate may be used to determine the temperature of a substrate. Similarly, characteristic wavelengths of a curve of the signal delta of a spectrum of EM radiation which has passed through the substrate may be used to determine temperature thereof. For example, the x-intercept of a line tangent to a curve of the signal delta defines the characteristic wavelength.

In yet further embodiments, a normalized signal delta of EM radiation passed through the substrate, or integrals thereof, is used to determine a temperature of a substrate. An exemplary normalized signal delta is the ratio of the difference in detected EM radiation intensity passed through the substrate at an elevated temperature and detected EM radiation intensity passed through the substrate at room temperature to the detected EM radiation intensity passed through the substrate at room temperature. Again, a characteristic wavelength of a curve of the normalized signal delta of a spectrum of EM radiation which has passed through the substrate may be used to determine the temperature thereof. For example, the x-intercept of a line tangent to a curve of the normalized signal delta defines the characteristic wavelength.

The method of determining the temperature of a substrate is selected in relation to the signal output of the radiation detectors and the desired signal-to-noise ratio. In some cases, the signal-to-noise ratio may be improved by using a combined approach. For example, a temperature of a substrate may be determined using both a slope between two inflection points and an integral. Additionally, a filter as described above can be used to improve the signal-to-noise ratio by preventing undesired wavelengths from being detected by the radiation detectors.

In certain embodiments, an incident radiation detector, such as incident radiation detector 180 of FIG. 1, is utilized to more precisely determine the intensity of the spectrum of EM radiation passed through the substrate. During operation, the EM radiation source is modulated which will change the detected intensity of the EM radiation spectrum passed through the substrate. In such cases, the detected intensity of the EM radiation spectrum passed through the substrate does not entirely correlate to a temperature of the substrate. The incident radiation detector detects the intensity of the spectrum of the EM radiation emitted by the EM radiation source at a positon before the emitted EM radiation interacts with the substrate. Since the intensity of the spectrum of incident EM radiation as detected is known, the intensity of the incident EM radiation spectrum can be related to the detected intensity of the spectrum of EM radiation passed the substrate to more precisely determine the intensity of the spectrum of EM radiation passing through the substrate.

In certain embodiments, the spectrometer detection result-temperature relationship is calibrated at 308 of FIG. 3 using the detector 190 of FIG. 1. A temperature of the substrate is determined, for example, using the radiation detected by the detector 190, here using the measured EM radiation emitted by the substrate and relating the result to temperature of the substrate. The temperature of the substrate determined using the radiation detected by the detector 190 is compared to the temperature of the substrate determined using the spectrometer. If the difference between the determined temperatures is greater than a predetermined tolerance, the spectrometer detection result-temperature relationship is recalibrated so that the corrected temperature of the substrate can be determined. In another embodiment, the relationship is set to a known standard, such as a result of a controlled test. The determined temperature using the spectrometer is compared to a known, expected temperature value for a given set of conditions (e.g. wafer type and EM radiation source output). If the determined temperature varies from the expected temperature by a predetermined tolerance, the spectrometer detection result-temperature relationship is recalibrated so the corrected temperature of the substrate can be determined. In another embodiment, a standard temperature profile of a substrate relating to a physical property, such as reflectivity or conductivity of the substrate, to temperature can be used to calibrate the various detectors described herein. Measurements of, for example, reflectivity and any of the other properties described elsewhere herein can be made, and the known relationship of temperature and reflectivity can be used to relate the properties described elsewhere herein to temperature to define a calibration curve. The calibration curve can then be used to determine the temperature of the substrate. The accuracy of the calibration curve can be checked by re-performing the calibration routinely and comparing the new curve to the old curve. In this way, drift in the instruments coupled to the chamber, for example from change in refractivity or diffractivity of the optical components of the radiation detectors with time or heat history, can be detected.

Further, the spectrometer detection result-temperature relationship may be calibrated for multiple substrate types to be processed. For example, a spectrum of detected EM radiation energy passed through a substrate at a given set of conditions, such as lamp type and the power provided thereto, is used to determine a wafer type and a corresponding calibration. In an exemplary method, an unknown substrate receives EM radiation emitted from an EM radiation source at a given set of conditions such as lamp type and EM radiation source output. A spectrometer detects the spectrum of EM radiation which has passed through the unknown substrate. The detected spectrum of EM radiation which has passed through the unknown substrate is compared to detected spectrums of EM radiation which has passed through known substrates of different types (such as substrate material, features formed therein or thereon, and layers formed thereon) at the given condition to determine the wafer type of the unknown substrate. The detected spectrums of EM radiation which have passed through the known substrates are, for example, known from a controlled test and stored in a database in a control system coupled to the spectrometer. The detected spectrums of EM radiation can be compared using one of the methods described above, such as slope, slope of a line tangent to the curve, or characteristic wavelength, among other methods. Once the wafer type of the unknown substrate is determined, a calibration of spectrometer detection result-temperature relationship corresponding to the detected wafer type is used to determine temperature of the substrate being processed.

While the foregoing is directed to embodiments of the present disclosure, other and further embodiments of the disclosure may be devised without departing from the basic scope thereof, and the scope thereof is determined by the claims that follow.

What is claimed is:
1. A thermal processing chamber, comprising:
a chamber body defining a processing volume;
a lamp assembly coupled to the chamber body;
a substrate support assembly coupled to the chamber body opposite the lamp assembly, the substrate support assembly defining a processing plane; and
a radiation detector for temperature measurement optically coupled to the lamp assembly and disposed opposite from the lamp assembly across the processing plane, wherein the radiation detector comprises:
a first light guide, comprising:
a first end coupled to the processing volume; and
a second end coupled to a detection volume;
a second light guide coupled to the detection volume, the second light guide disposed along an axis that is substantially perpendicular to a major axis of the detection volume, the second light guide further comprising:
a first end adjacent to the detection volume and comprising a bevel; and
a second end coupled to the first end of the second light guide and comprising a fiber connection;
a spectrometer coupled to the second light guide via an optical fiber; and
a pyrometer coupled to the detection volume opposite the first light guide.

2. The chamber of claim 1, wherein the lamp assembly comprises a plurality of lamps arranged in a honeycomb array.

3. The chamber of claim 2, wherein an axis of a lamp of the plurality of lamps is concentrically aligned with an axis of a probe coupled to the radiation detector.

4. The chamber of claim 1, wherein the bevel forms an angle of 45 degrees relative to a plane substantially perpendicular to the axis of the second light guide.

5. The chamber of claim 1, wherein the second light guide has a diameter of 1 millimeter.

6. The chamber of claim 1, further comprising one or more second radiation detectors optically coupled to the lamp assembly.

7. The chamber of claim 6, wherein the one or more second radiation detectors comprises a spectrometer.

8. The chamber of claim 6, wherein one of the one or more second radiation detectors detect radiation at a position before the said radiation interacts with the substrate support assembly.

9. The chamber of claim 6, wherein the one or more second radiation detectors comprises a pyrometer.

10. The chamber of claim 1, further comprising a controller coupled to the radiation detector and the lamp assembly.

11. An optical temperature measuring device, comprising:
a first light guide coupled to a detection volume;
a second light guide coupled to the detection volume, the second light guide disposed along an axis that is substantially perpendicular to a major axis of the detection volume, the second light guide further comprising:
a first end adjacent to the detection volume and comprising a bevel; and
a second end coupled to the first end and comprising a fiber connection;
a spectrometer coupled to the second light guide via an optical fiber; and
a radiation detector coupled to the detection volume opposite the first light guide.

12. The device of claim 11, wherein the bevel is 45 degrees measured relative to a plane that is perpendicular to a central axis of the second light guide, the second light guide having a diameter of 1 millimeter.

13. The device of claim 11, wherein the radiation detector is a pyrometer.

14. The device of claim 11, wherein the radiation detector detects blackbody radiation.

15. The device of claim 11, further comprising:
a probe coupled to the first light guide, the probe comprising a filter for preventing undesired wavelengths of radiation from passing into the first light guide.

16. The device of claim 15, wherein the filter is a reflective or absorptive coating.

17. A thermal processing chamber, comprising:
a chamber body defining a processing volume;
a lamp assembly coupled to the chamber body, the lamp assembly comprises a plurality of lamps arranged in a honeycomb array;
a first radiation detector for temperature measurement coupled to the lamp assembly and configured to receive radiation emitted directly from the plurality of lamps;
a substrate support assembly coupled to the chamber body opposite the lamp assembly, the substrate support assembly defining a processing plane; and
a second radiation detector for temperature measurement optically coupled to the lamp assembly and disposed opposite from the lamp assembly across the processing plane, wherein the second radiation detector comprises:
a first light guide comprising:
a first end coupled to the processing volume; and
a second end coupled to a detection volume;
a second light guide coupled to the detection volume, the second light guide further comprising:
a first end adjacent to the detection volume and comprising a bevel; and
a second end directly coupled to the first end of the second light guide and comprising a fiber connection for fiber optic coupling with a spectrometer;
the spectrometer coupled to the second light guide for detecting transmitted radiation in the processing volume; and
a pyrometer coupled to the detection volume opposite the first light guide for detecting blackbody radiation in the processing volume.

18. The chamber of claim 17, wherein an axis of a lamp of the plurality of lamps is concentrically aligned with an axis of a probe coupled to the second radiation detector.

19. A thermal processing chamber, comprising:
a chamber body defining a processing volume;
a lamp assembly coupled to the chamber body, the lamp assembly comprises a plurality of lamps arranged in a honeycomb array:
a first radiation detector for temperature measurement coupled to the lamp assembly and configured to receive radiation emitted directly from the plurality of lamps;
a substrate support assembly coupled to the chamber body opposite the lamp assembly, the substrate support assembly defining a processing plane;
a second radiation detector for temperature measurement optically coupled to the lamp assembly and disposed opposite from the lamp assembly across the processing plane, wherein the second radiation detector comprises:
a first light guide with a first end coupled to the processing volume and a second end coupled to a detection volume;
a second light guide coupled to the detection volume;
a spectrometer coupled to the second light guide for detecting transmitted radiation in the processing volume; and
a pyrometer coupled to the detection volume opposite the first light guide for detecting blackbody radiation in the processing volume; and
a third radiation detector coupled to the lamp assembly for measuring radiation reflected in the processing volume.

* * * * *